(12) United States Patent  
Visser (10) Patent No.: US 7,408,618 B2  
(45) Date of Patent: Aug. 5, 2008

(54) LITHOGRAPHIC APPARATUS SUBSTRATE ALIGNMENT

(75) Inventor: Raimond Visser, Best (NL)

(73) Assignee: ASML Netherlands B.V., Veldhoven (NL)

(*) Notice: Subject to any disclaimer, the term of this patent is extended or adjusted under 35 U.S.C. 154(b) by 328 days.

(21) Appl. No.: 11/170,796

(22) Filed: Jun. 30, 2005

(65) Prior Publication Data

US 2007/0002298 A1 Jan. 4, 2007

(51) Int. Cl.
G03B 27/42 (2006.01)
G03B 27/32 (2006.01)
G01B 11/00 (2006.01)

(52) U.S. Cl. .................... 355/53; 355/77; 356/401
(58) Field of Classification Search ........... 356/399, 356/400, 401; 355/53, 77; 430/22, 30
See application file for complete search history.

(56) References Cited

U.S. PATENT DOCUMENTS

| | | | | |
|---|---|---|---|---|
| 5,627,624 A | * | 5/1997 | Yim et al. ............... | 355/53 |
| 5,795,687 A | * | 8/1998 | Yasuda .................. | 430/22 |
| 5,798,195 A | * | 8/1998 | Nishi .................... | 430/22 |
| 6,635,395 B2 | * | 10/2003 | Hahmann et al. ........ | 430/22 |
| 2005/0089762 A1 | * | 4/2005 | Consolini et al. ....... | 430/5 |

* cited by examiner

*Primary Examiner*—Alan A Mathews  
(74) *Attorney, Agent, or Firm*—Pillsbury Winthrop Shaw Pittman LLP (57) ABSTRACT

A method for aligning a substrate in a lithographic apparatus includes determining from a geometric reference of the substrate a position of a window on the substrate. The window indicates an area in which an alignment mark of the substrate may be expected. Then, a position of the alignment mark is measured in the window. A relationship between the measured position of the alignment mark and the position of the window is determined. The relationship is stored in a database and the substrate is aligned making use of the measured position of the alignment mark.

The above may be repeated for a following aligning of the substrate, prior however to the measuring of the position of the alignment mark in the window, the position of the window is amended making use of the relationship between the measured position of the alignment mark and the position of the window as stored in the database for one or more preceding alignings.

19 Claims, 5 Drawing Sheets

|    | C1  | C2  | C3  | C4  | C5  | AV  |
|----|-----|-----|-----|-----|-----|-----|
| W1 | D11 | D12 | D13 | D14 | D15 | AV1 |
| W2 | D21 | D22 | D23 | D24 | D25 | AV2 |
| W3 | D31 | D32 | D33 | D34 | D35 | AV3 |

LITHOGRAPHIC APPARATUS SUBSTRATE ALIGNMENT

BACKGROUND

1. Field of the Invention

The present invention relates to methods for aligning a substrate in a lithographic apparatus, a method for diagnosing a manufacturing device, computer programs to perform the methods and a data processing device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

When a substrate is processed by a lithographic apparatus, an accurate positioning of the substrate is desirable to enable an accurate processing (e.g., applying a pattern onto the substrate) by the lithographic apparatus. Commonly, such an aligning is performed in steps. In a first step a geometric reference of the substrate is detected, which might, e.g., comprise markings at an edge of the substrate, the edge of the substrate itself, some points at the edge of the substrate etc. Starting from these points, an area (or a plurality of areas) are determined in which alignment marks of the substrate are expected. Such area is referred to in this document as a window. The term window is thus in this document to be understood as an area on the substrate in which the alignment mark is expected. Also, the term window may be understood in this document as a capture range of a sensor to detect the alignment mark. In a well-dimensioned system, the capture range of the sensor to detect the alignment mark may at least equal the area or window in which the alignment mark is expected. To avoid any misunderstanding, it is remarked that the window is commonly not marked or outlined on the substrate itself, thus may be considered an imaginary window. Once the area(s) or window(s) has/have been determined, in the window(s), the position of the alignment mark(s) is measured. Thus, first a coarse approximation of the position of the alignment mark is determined, by determining a position of the window, and then in the window a more accurate position measurement is performed.

Thus, when aligning, a stepwise approach is followed: first, using the wafer edge, a pre-alignment is performed. The pre-alignment provides for an area in which the alignment mark may be expected, in other words a position of the window on the substrate. Then, in a second step the position of the alignment mark in the window is detected, which step is commonly considered part of the alignment. Commonly, to be able to accurately align the substrate, a plurality of alignment marks are applied, e.g., four alignment marks for a 1 dimensional measurement, or two alignment marks for a 2 dimensional measurement. To further improve accuracy, positions of additional alignment marks can be taken into consideration.

An implication of this method of alignment is that it is desirable to have a measurement system which meets high specifications to measure the position of the alignment mark in the window. On the one hand, a size of the window is desired to be large, as the expected position of the alignment mark might show fluctuations due to an inaccuracy in a determination of the position of the window, and inaccuracy in the geometric references used for the determination of the window, etc. On the other hand, accuracy requirements on a lithographic apparatus are high and in particular a positioning accuracy or alignment accuracy of the lithographic apparatus is in general high to allow an accurate positioning of a following layer, e.g., on top of a previous layer. The higher the accuracy requirements for the aligning of the substrate, the higher in general an accuracy of the position measurement of the alignment mark is to be. Therefore, requirements on a measurement system to measure the position of the alignment mark in the window, increase: on the one hand, a large size of the window is required to cope with tolerances of a varying origin, while on the other hand a highly accurate position measurement of the reference mark is required.

A further aspect is that in a manufacturing environment where lithographic apparatuses may be used (e.g., a manufacturing of electronic semiconductor circuits), it is not uncommon to make use of lithographic apparatuses and other equipment from a multiplicity of vendors. It is in such an environment not unimaginable that a particular substrate is first processed by a lithographic apparatus, and then (e.g., for applying a following layer) processed by a different lithographic apparatus. Lithographic apparatuses of different types or different manufacturers may make use of different alignment methods. Therefore, a tolerance at the position of the alignment mark may be high: as an example, a substrate may be processed by a first lithographic apparatus, the processing by the first lithographic apparatus, e.g., comprising an application of one or more alignment marks on the substrate. Then, after suitable developing steps, the substrate may be processed by a second lithographic apparatus, the processing comprising an aligning of the substrate to the second lithographic apparatus. As the reference marks have been applied by the first lithographic apparatus, additional tolerances may come into existence due to differences between the lithographic apparatuses due to, e.g., a different method for determining the position of the window on the substrate, different geometric references applied for the determining of the position of the window on the substrate, different accuracies and errors of each of the lithographic apparatus, etc. Due to all these sources of errors, the area in which the alignment mark is to be looked for will increase, thus bringing forward a desire to increase the size of the window.

A still further aspect is that a high throughput of the lithographic apparatus is desired, which translates into a fast detection of a position of the alignment mark, which translates into a simple position measurement of the reference mark in the window. Current measurement techniques, however, have a limited dynamic range, i.e., a limited range between the accuracy, which is to be achieved, and the maximum range over which the measurement can be performed. Thus, given a certain required accuracy, the size of the window cannot be increased above a limit with which the measurement system is able to cope.

SUMMARY

According to an embodiment of the invention, there is provided a method for aligning a substrate in a lithographic apparatus, the method comprising a) determining from a geometric reference of the substrate a position of a window on the substrate, the window indicating an area in which a alignment mark of the substrate may be expected, b) measuring a position of the alignment mark in the window, c) determining a relationship between the measured position of the alignment mark and the position of the window, d) storing in a database for the substrate the relationship between the measured position of the alignment mark and the position of the window, e) aligning the substrate making use of the measured position of the alignment mark, and f) repeating a) to e) for a following aligning of the substrate, wherein prior to b) the position of the window is amended making use of the relationship between the measured position of the alignment mark and the position of the window as stored in the database for at least one preceding aligning.

In another embodiment of the invention, there is provided a method for aligning a substrate in a lithographic apparatus, the method comprising, a) determining from a geometric reference of the substrate respective positions of at least two windows on the substrate, the windows indicating areas in which a respective alignment mark of the substrate may be expected, b) measuring a position of the respective alignment mark in each of the windows, c) determining for each of the alignment marks, a difference between the measured position of the respective alignment mark and an expected alignment mark position of the respective window, d) determining a position of the substrate at which a total of the differences would be reduced, and e) bringing the substrate to the determined position.

According to still another embodiment of the invention, there is provided a method for determining a drift error of a lithographic apparatus, the method comprising: a) determining from a geometric reference of at least two substrates a position of a window on each of the substrates, the window indicating an area in which an alignment mark of the substrate may be expected; b) measuring for each of the substrates a position of the alignment mark in the window; c) determining for each of the substrates a relationship between the measured position of the alignment mark and the position of the window; d) storing in a database for each of the substrates the relationship between the measured position of the alignment mark and the position of the window; e) repeating a) to d) at least once; f) averaging for each of the substrates the relationships as stored in d); g) determining, for each of the at least two substrates, a difference between the stored relationships and the averaged relationships; and h) determining the drift error of the lithographic apparatus by determining an average of the differences as determined in g).

According to yet another embodiment of the invention, there is provided a method for diagnosing a manufacturing device, the manufacturing device to process a plurality of objects, the method comprising:

detecting a parameter of an object to be processed by the manufacturing device;

storing the detected parameter of the object in a database; and deriving a diagnostic information from the stored parameter.

According to a further embodiment of the invention, there are provided computer programs providing program instructions to, when running on a computer, perform the methods according to the invention.

According to a still further embodiment of the invention, there is provided a data processing device comprising program instructions to perform the methods according to the invention, the data processing device being operationally connected to at least one lithographic apparatus or manufacturing device respectively, and to the database.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
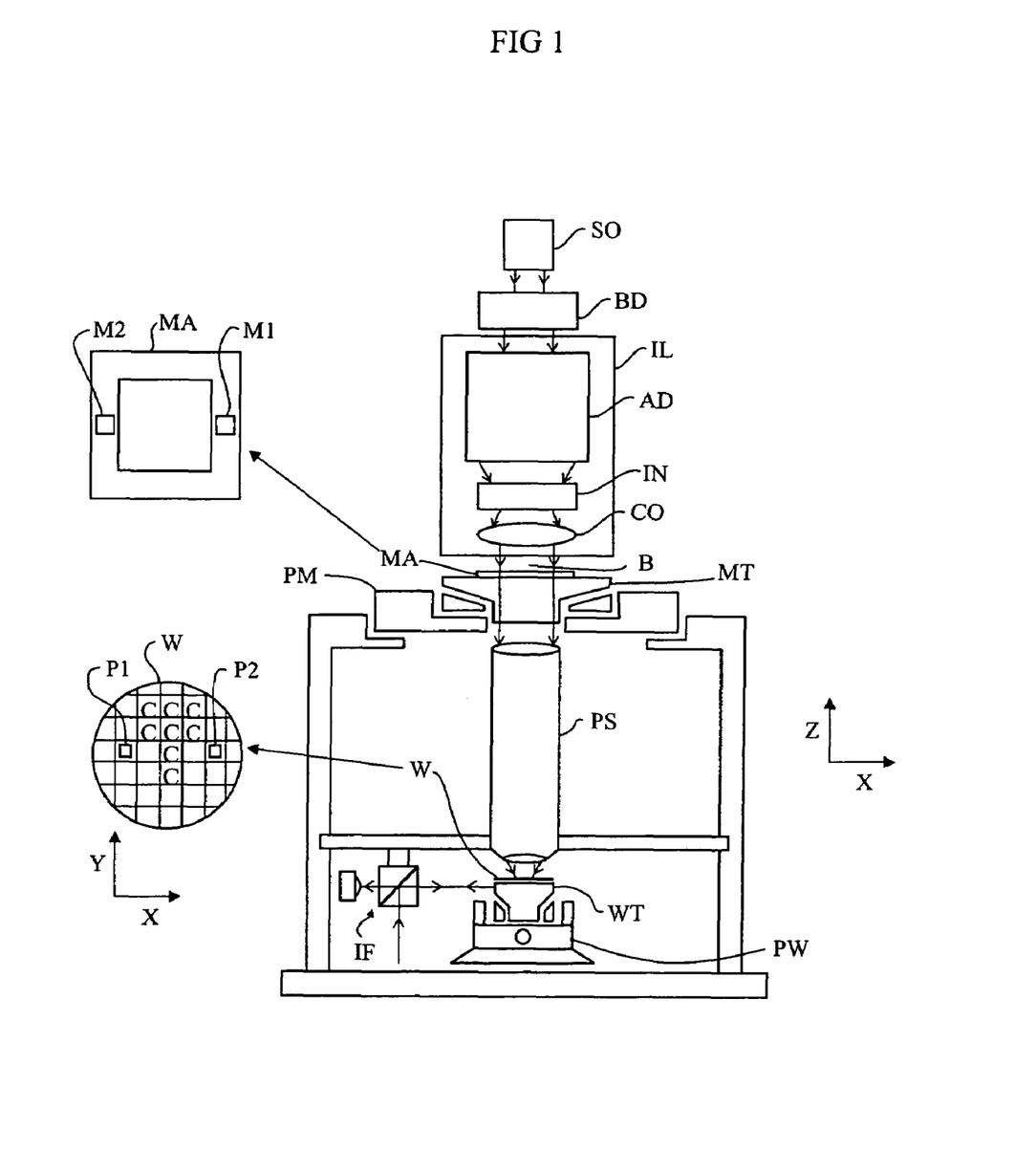
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g. a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system.

Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
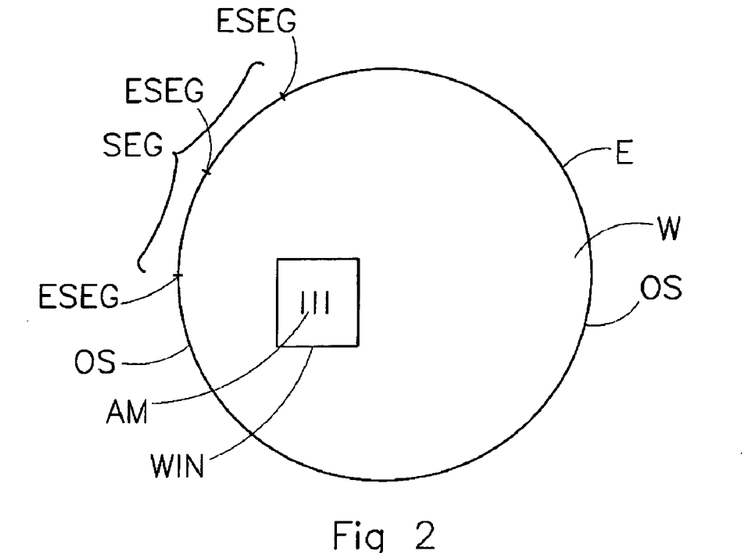
FIG. 2 depicts a substrate having an alignment mark.
Figure 7:
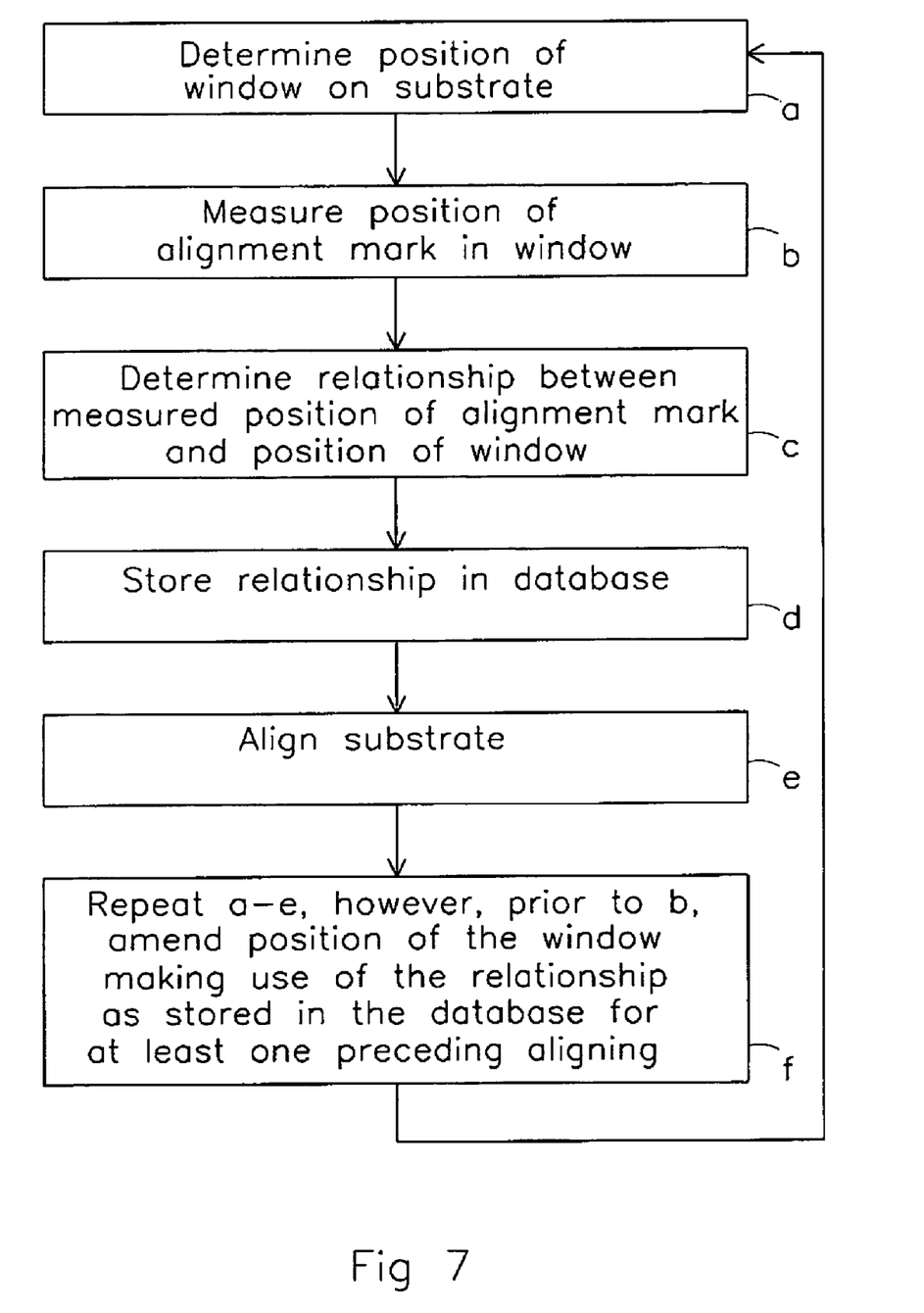
FIG. 7 depicts a flow diagram describing an alignment method.

FIG. 2 shows a top view of a substrate comprising an alignment mark AM. Further, FIG. 2 shows a window WIN (which may have any shape, e.g., circular, rectangular, square, etc.) in which the alignment mark may be expected. The alignment mark may have any shape or pattern, comprising, e.g., a grid, a cross, a dot, a plurality of parallel lines, etc. When aligning, a position of the window WIN on the substrate W is determined from a geometric reference of the substrate, such as the edge E, e.g., by detecting the edge at opposite sides OS of the substrate W, detecting the edge at a plurality of locations ESEG in a segment SEG of the edge of the substrate. Starting from the geometric reference, the lithographic apparatus may determine (e.g., calculate, project, extrapolate, etc.) a position of the window WIN, as also depicted in FIG. 7, step a. In the example shown in FIG. 2, the alignment mark AM does indeed fall in the window WIN. When the position of the window WIN has been determined, the position of the alignment mark AM is measured in the window, as also depicted in FIG. 7, step b. The measuring of the position of the alignment mark AM in the window WIN may comprise a localization of the alignment mark AM in the window followed by a position measurement of the alignment mark AM, however other measurement principles such as a direct position measurement in the window WIN are possible to, as well as any other suitable position measurement. After detecting the alignment mark, an alignment of the substrate W may take place, the alignment may, e.g., comprise a displacement of the substrate such that the alignment mark AM coincides with another reference, e.g., a reference of the lithographic apparatus, a reference of a mask which is to be projected onto the lithographic apparatus, etc. The aligning may also comprise a setting of the projection system of the lithographic apparatus such that the pattern of the mask, when projected onto the substrate by the projection system, matches, e.g., existing patterns on the substrate.

Figure 3A:
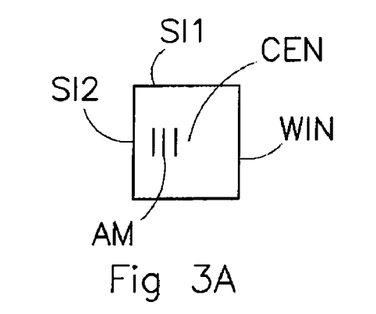
FIGS. 3a and 3b each depict an alignment mark and a window in which the alignment mark may be expected.

FIG. 3a depicts a window WIN on a surface of a substrate and an alignment mark AM. In this example, the alignment mark AM is located in the window. As described with reference to FIG. 2, the position of the window may have been determined from a geometric reference of the substrate, the window indicating an area in which the alignment mark AM of the substrate may be expected. As described with reference to FIG. 2, the position of the alignment mark AM in the window is measured. The position measurement of the alignment mark AM in the window WIN may comprise a measurement of the position of the alignment mark AM with respect to a centre CEN of the window WIN, however numerous other possibilities are imaginable, e.g., a measurement of the position of the alignment mark AM with respect to sides SI1, SI2 of the window WIN or any other suitable position relationship, e.g., between the position of the alignment mark and any other part, reference or element of the window.

Figure 4:
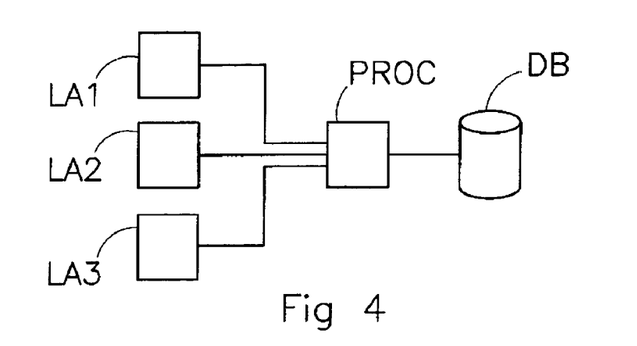
FIG. 4 highly schematically depicts a manufacturing environment comprising a plurality of lithographic apparatus.

According to an embodiment of the invention, a relationship between the measured position of the alignment mark AM and the position of the window WIN is now determined, as also depicted in FIG. 7, step c. This determining of the relationship may, e.g., comprise a determining of an offset between the measured position of the alignment mark AM and the position of the centre CEN of the window WIN, as explained above. Other, alternative relationships are imaginable too, comprising, e.g., a relationship between a position of the alignment marker AM and one or more sides such as SI1, SI2, . . . . of the window WIN etc. Then, as also depicted in FIG. 7, step d, the relationship between the measured position of the alignment mark AM and the position of the window WIN is stored in a database, such as the database DB as depicted in FIG. 4. Then, the substrate may be aligned making use of the measured position of the alignment mark AM, see also FIG. 7, step e.

For a following aligning of the substrate W, the geometric reference is used for determining a position of the window WIN on the substrate, the window indicating the area in which the alignment mark may be expected. In between subsequent aligning of the substrate, the substrate may leave but need not necessarily have left the lithographic apparatus to be processed by another apparatus.

Figure 3B:
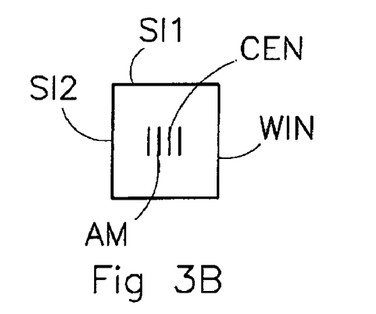

When, e.g., a following layer is to be created on the substrate, a following aligning of the substrate may take place, e.g., in a further process step in a processing of the substrate. Again, the geometric reference may be used to determine a position of the window on the substrate, as explained above. Prior to measuring a position of the reference mark in the window however, the position of the window may, according to an embodiment of the invention, be amended, making use of the relationship between the measured position of the reference mark and the information stored in the database for the preceding aligning (or for a plurality of preceding alignings), as also depicted in FIG. 7, step f. An example thereof is depicted in FIG. 3b. As described with reference to FIG. 3a, at a previous measuring of the position of the alignment mark, it appeared that the alignment mark was not positioned at a centre CEN of the window WIN in FIG. 3a (or in more general words the relationship between the measured position of the alignment mark and the position of the window did not show an optimum relationship). As the relationship between the measured position of the alignment mark (as measured for the previous aligning) and the position of the window has been stored in the database, this information may be used to determine an amended position for the window now. In this example, it appeared that the alignment mark AM was located left from the centre CEN of the window WIN (see FIG. 3a) in the previous measurement. This relationship has in this example been stored in the database (for example in terms of an offset between the alignment mark AM and the centre CEN of the window WIN. As an example, the amending of the position of the window may consist of a displacement of the window resulting in a positioning of the window WIN such that the centre CEN of the window WIN coincides with the position where at the previous measurement as described with reference to FIG. 3a, the alignment mark has been found. Now, a probability that the alignment mark AM is found within the window WIN is increased, as the position of the window WIN has been amended based on data of one or more previous measurements of the alignment mark. Due to tolerances, such as tolerances of the lithographic apparatus, the position of the alignment mark AM in the present aligning may deviate from the position of the alignment mark as found in a previous aligning (see FIG. 3a). As however the window is in FIG. 3b placed at a suitable position matching measurements of the alignment mark in one or more previous alignments, a likelihood to find the alignment mark AM in the window WIN may have been increased. As described, it is possible that the relationship between the measured position of the alignment mark and the position of the window comprises an offset between the measured position of the alignment mark and the position of the centre of the window. In that example, the offset may be stored in the database. Therewith, a simple relationship is created which provides for a simple parameter, i.e., a one-dimensional or two-dimensional offset, which may easily be stored in the database. It is remarked that when performing an alignment, commonly positions of several, e.g., 2 or 4 or more, alignment marks are measured. Therefrom, it may be possible to determine a multi-dimensional relationship between the positions of the windows and the measure positions of the alignment marks, the relationship, e.g., comprising a position in a plane parallel to a surface of the substrate and a rotation around an axis perpendicular to the surface of the substrate. Further, it is remarked that, when the positions of the alignment marks have been determined, a co-ordinate transformation may be performed: the positions of the windows may have been determined based on a co-ordinate system derived from the geometric reference. As the positions of the alignment marks have been detected, the co-ordinate system may be subjected to a transformation to have the windows (e.g., the centres thereof) coincide with the positions of the reference marks. Now that the amended position of the window is determined, as depicted in FIG. 3b, the position of the alignment mark in the window is measured. The relationship between the measured position and the position of the window may be determined, e.g., by determining the offset between the centre of CEN of the window and the position of the alignment mark AM. This relationship, or in this example the offset, may then be stored in the database. The process of determining a position of the window, amending the position of the window, measuring the position of the alignment mark in the window, determining the relationship, storing the relationship in the database and aligning the substrate may be repeated for each alignment of the substrate. The amending of the position of the window may take place based on a single previous measurement of the relationship (e.g., the offset as stored in the database), or on a plurality of relationships as determined in a plurality of previous measurements, thereby averaging out errors thus providing for a more reliable production of a position of the alignment mark. When data stored with at least two preceding alignments is taken into account, the data, e.g., comprising an offset, the offsets as stored in the database may be averaged, thus averaging out statistical fluctuations to provide a more reliable prediction of the position of the alignment mark. In the averaging, the offsets as stored in the database may be taken into account as is, however it is also possible, for increasing a stability of the averaging process, that the offsets as stored in the database are multiplied by a weight factor before the averaging. The weight factor may have a constant value, however it is also imaginable that the weight factor increases for a following alignment, e.g., towards an end value after a plurality of alignments. By initially keeping the weight factor low, instabilities or other deviations by the averaging may be avoided, while the more measurement data have been made available, the more the wait factors may be increased thus obtaining more benefit from the averaging. The inventors have devised that a suitable end value for the weight factor might be in a range of 0.5 to 0.7, providing a balance between stability of the averaging on the one hand and accuracy on the other hand.

FIG. 4 shows a plurality of lithographic apparatus LA1, LA2, LA3, which may be of the type and constructions as shown and described with reference to FIG. 1, however may be any other type of lithographic apparatus instead. The lithographic apparatuses LA1, LA2 and LA3 may be of a same type and manufacturing, however may also comprise different types of lithographic apparatuses or lithographic apparatuses originating from different manufacturers. The lithographic apparatuses LA1, LA2 and LA3 are connected to a processing unit PROC such as a computer, a microprocessor, a computing system, a plurality of computers etc. The connection may consist of any type of data connection, comprising, for example, an analogue or digital electrical connection, an optical connection such as a glass fibre, a wireless connection, a network connection. Also, it is possible that a plurality of processing units PROC are provided, e.g., a separate one for each lithographic apparatus LA1, LA2, LA3. The processing unit PROC stores data in a database DB, the database may be connected to the processing PROC by any type or suitable connection, such as analogue, digital or any of the other connections as described with reference to the connections between the lithographic apparatuses LA1, LA2, LA3 and the processing unit PROC. During each alignment process, the lithographic apparatus LA1, LA2, LA3 may provide data to the processing PROC, comprising, e.g., the determined position of the window, the measured position of the alignment mark in the window, etc. The processing unit PROC may calculate a relationship between the measured position of the alignment mark and the position of the window therefrom and stores the relationship in the database DB. From data in the database DB, the processing unit may calculate an amendment of the position of the window making use of the relationship between the measured position of the alignment mark and the position of the window as stored in the database.

Figure 5:
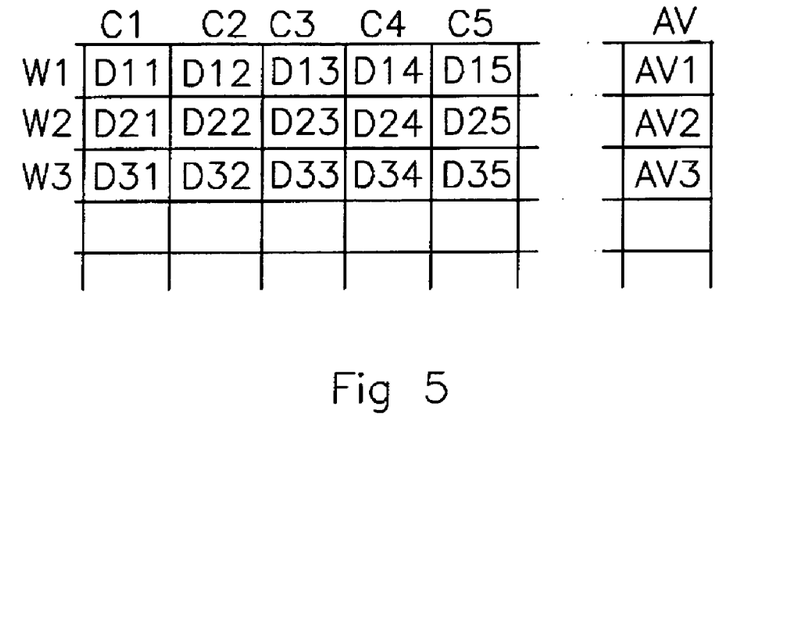
FIG. 5 depicts a table representing alignment data of a plurality of substrates.

FIG. 5 shows a table as an example of a content of the database DB. For a substrate W1, W2, W3, data entries are depicted along lines in the table, thus alignment data such as offset data representing the relationship are depicted for wafer W1, W2, W3 etc. It is possible that the data for a particular substrate W1, W2, W3 has been determined at a single lithographic apparatus, however it is also possible that these data originate from measurements at different ones of the lithographic apparatuses, such as when for example some process steps on the substrate have been carried out by lithographic apparatus LA1, while others have been carried out by lithographic apparatus LA2 or LA3. In general, a position error of the alignment mark, i.e., a difference between the actual position of the alignment mark and the position as would have been expected based upon the determining the position of the window on the substrate from the geometric reference, the error, e.g., being expressed as a difference between the centre of the window as determined from the geometric reference and the measured position of the window, this error may consist of a plurality of contributions to the error. In more detail, the error may consist of three error sources: a first source of errors may comprise the offset in the substrate itself. In an initial process step, the substrate may be provided with the alignment mark or alignment marks and a tolerance with which the alignment marks are created on the substrate is expressed in the substrate dependent offset. A second source of error may comprise a machine variation, i.e., a tolerance of the lithographic apparatus, which processes the substrate. A third source of error may comprise a drift of the lithographic apparatus, which processes the substrate. A difference between the second source of error and the third source of error is that the second source of error, i.e., the machine variation is uncorrelated for each measurement, while the drift shows a certain amount of correlation for consecutive measurements on a same lithographic apparatus. By averaging the alignment error, thus, e.g., the offset between the measured position of the alignment mark and the position of the centre of the window, uncorrelated sources of error will be averaged towards zero and thus reduced. Therefore, if the measurements are performed on a plurality of lithographic apparatuses, both the machine variation and the machine drift, i.e., the second and third sources of error will be averaged, thus the averaged error providing an indication of the offset of the particular substrate, thus, e.g., the difference between the actual position of the alignment mark and the position of a centre of the window, which would have been expected upon determination of the position of the window from the geometric reference. Such an averaging may be understood as an averaging along a horizontal line in the table according to FIG. 5. In case that in such an averaging data obtained from a single lithographic apparatus is taken into account, the result of the averaging will provide a sum of the wafer dependent error (i.e., the first source of errors) and the machine drift, i.e., the third source of error. Due to the data in the database, the processing unit PROC may provide for a correction of the position of the window as determined from the geometric reference. The averaged alignment error may thus be used as a prediction of the error that will be present, and thus to amend the position of the window. Thus, the more alignments have been performed and thus in general the more layers have been created on the substrate, the better the prediction of the error, as the averaging gets more accurate the more measurement data of previous alignment have been stored in the database. The more processing has been performed on a particular substrate, and thus in general the more layers have been created on the substrate, the higher a value of the substrate will be, as a misalignment would create a layer which is not aligned with previous layers, and which would necessitate to either scrap the substrate or water or attempt to rework it. Thus, the higher the value of the substrate gets during consecutive processing steps, the higher an accuracy of the prediction of the error gets, and thus the less the risk gets that the particular substrate ends up in a misaligned position which may result in damage thereto by a misaligned layer. As an example, when for substrate W1 the first alignment is performed, data may be entered as D11 in the database DB, the data D11 comprising, e.g., the offset between the position of the alignment mark and the centre of the window. The data entry D11 may be used as a first entry for AV1 in a column Average AV in the table. Then, upon a second alignment, data entry D12 may be provided. An average may now be determined from D11 and D12 and stored in AV1, etc. The average as stored in AV1 may now be used to correct the position of the window for a following aligning, as has been explained above. The average may comprise a weighted average, a moving average, or any other average. As an example, the averaging may comprise a repeated adding of a part of the alignment error (or alignment offset) to a total sum, this averaging providing for a kind of low pass filtering of stored alignment errors. In case of a weighted average, a plurality of weight factors may used, such as to provide a different weight to previous measurement results. An example may be to only use the last 4 measurements, providing each of them with a same of different weight factors.

It is remarked that the database may comprise any form of database, and does not necessarily comprise a structure in a form of a table as described and depicted here. The database may as an example comprise a relational database, and may be stored in any storage device, comprising, e.g., a semiconductor memory, a magnetic or optical disk or tape, etc. or any type of computer file. Also, the database may consist of a plurality of databases, e.g., a plurality of databases for a single lithographic apparatus or a separate database for each lithographic apparatus in a configuration as described and depicted with reference to FIG. 4, etc.

Apart from the averaging or other suitable operation performed on data on a horizontal line in the table as depicted in FIG. 5, other operations on the data are possible too. As an example, it is possible to determine the drift, i.e., the third source of error. Similarly as explained above, after some— e.g., 3, 4, 5 or more—cycles comprising a, b, c and d, an indication of the substrate offset, thus an indication of the first source of error may be provided with a sufficient degree of accuracy by an averaging operation to the offsets found in each cycle. The average could be stored in the database, e.g., in the columns Av in the example described here, and, e.g., updated each time applicable additional data becomes available. By now subtracting this average from the total error for each measurement as stored in the database and averaging the results of the subtraction, an indication on the third source of error may be obtained. Also, the variation between the result of each of the subtractions and the drift as obtained with the averaging provides an indication on the machine variation. In case that excessive values thereof would occur, the processing unit PROC may provide for a signaling to indicate, e.g., a possible problem of a particular lithographic apparatus. An example of the determination of the drift may be to average along a vertical column C5 in FIG. 5. Before the averaging, the difference between the measured error and the substrate dependent offset (i.e., the first source of error for each of the substrates) is determined. This wafer dependent error may be different for each of the substrates. Then, the results of these subtractions are averaged, thus taking out the machine variation (i.e., the second source of error) as the second source of error is uncorrelated. The average thus provides an indication for the drift, i.e., the third source of error. When a single lithographic apparatus is used for multiple layers, and thus multiple alignments on a same substrate, then the difference between the first and third sources of errors may not be determinable. In such a case, a monitoring of a condition could be done making use of the average offset of the substrate. Instead of the offset as described above, any other similar relationship between the window and the alignment mark may be applied.

The embodiments of the invention as described with reference to FIGS. 2, 3, 4 and 5 thus provide for an improved aligning as results of a previous aligning, and in particular a relationship between a position of the alignment mark as measured and the position of the window as determined are stored in a database, allowing a variety of data processing operations thereon, which enable, e.g., a determination of an estimate of the offset of in particular substrate. Benefits obtained include a more reliable aligning, as a better estimate on the position of the alignment mark may be obtained before actually performing the measurement to detect the alignment mark, better interoperability between various lithographic apparatuses of different types, manufacturers etc. as error budgets may be reduced due to the operations performed on the data in the database, etc.

Figure 6:
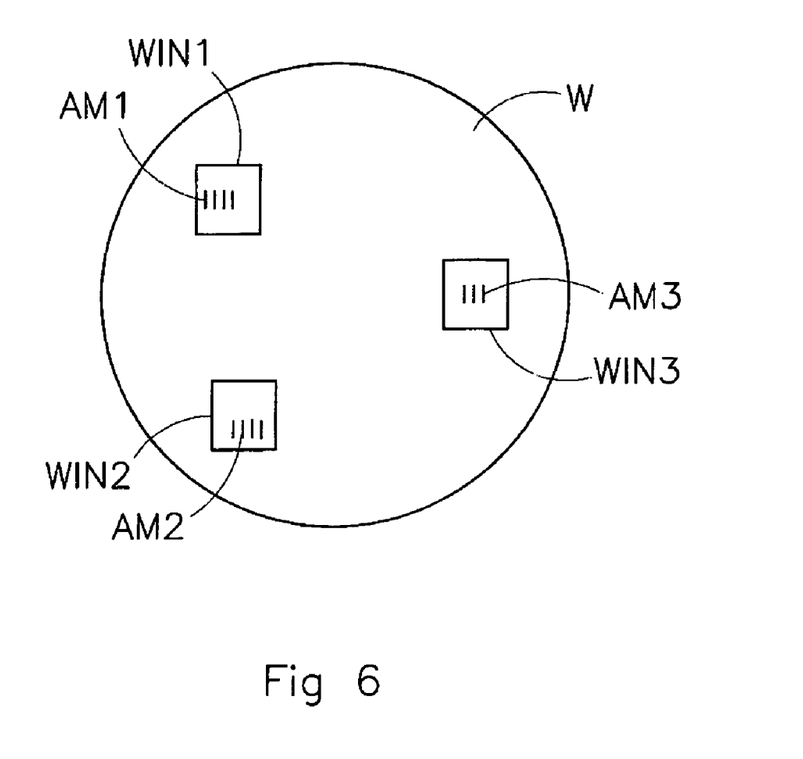
FIG. 6 depicts a substrate comprising a plurality of alignment marks.
Figure 8:
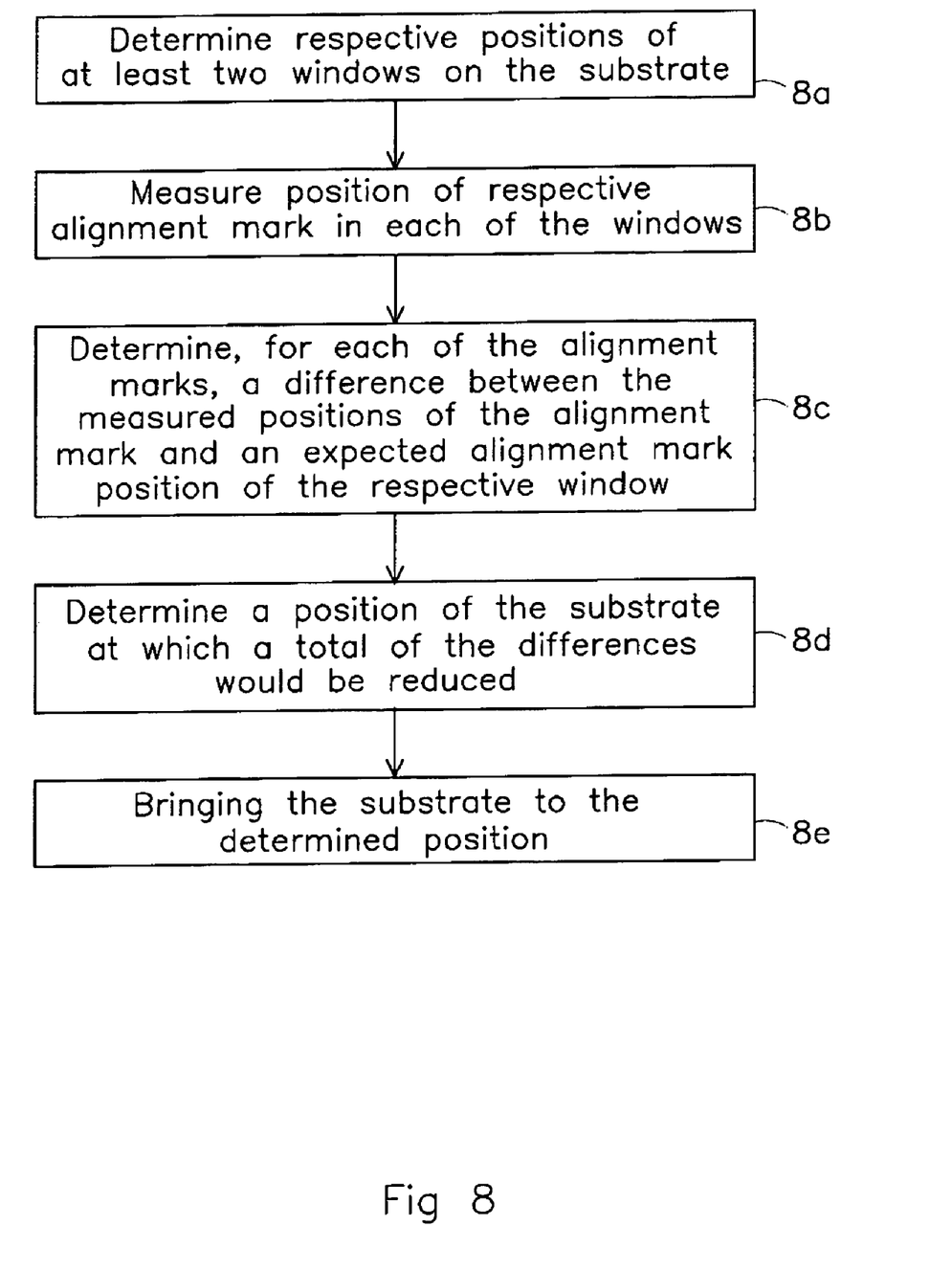
FIG. 8 depicts another flow diagram describing another alignment method.

In an embodiment of the invention, positions of at least two windows on the substrate are determined from a geometric reference, see also FIG. 8, step 8*a*. In the example as shown in FIG. 6, the positions of three windows are determined. Then, a position of the respective reference mark in each of the windows is measured, see also FIG. 8, step 8*b*. For each of the reference marks, a difference between the measured position of the respective alignment mark AM1, AM2, AM3 and a position of the window WIN1, WIN2, WIN3 or an expected reference mark position in the respective window WIN1, WIN2, WIN3 is determined, as also depicted in FIG. 8, step 8*c*. Then, a position of the substrate W is determined at which a total of the differences between the measured positions and the expected reference marked positions would be reduced (FIG. 8, step 8*d*). The position may, e.g., be a position at which the total of the differences is minimised. The substrate may now be brought into the determined position (FIG. 8, step e) (e.g., by a handler before placing the substrate in the lithographic apparatus). A benefit is that the bringing of the substrate to such a position will need less translation or rotation of the substrate table on which the substrate W is positioned, which will result in a more accurate position measurement of the substrate, as the position of the substrate is commonly measured with a plurality of interferometers or other optical sensors, a property of which is that they tend to deteriorate in performance when deviating from an optimum position. By now positioning the substrate on the substrate table such that it is close to the optimum position, little manipulations of the substrate table WT itself are required to get to the position at which the substrate is aligned, thus the substrate table only deviating from the optimum position to a small extent.

Although the above examples relate to a lithographic apparatus, the invention may also be applied in many other applications, thus can also in general words be summarized as a method for diagnosing a manufacturing device, the manufacturing device to process a plurality of objects, the method comprising: detecting a parameter of an object to be processed by the manufacturing device; storing the detected parameter of the object in a database; and deriving a diagnostic information from the stored parameter. The deriving the diagnostic information from the stored parameter may comprise deriving the diagnostic information from stored parameters for a plurality of objects (e.g., to diagnose for object related items), deriving the diagnostic information from stored parameters for at least two manufacturing devices (e.g., to diagnose for manufacturing device related items or differences), and/or deriving the diagnostic information from stored parameters for a plurality of processings of a same object. The manufacturing device may comprise any device to process objects, however, as explained above, the method may be very suitable to, but need not be restricted to a lithographic apparatus, a substrate handler, and a substrate etching machine. The parameter may comprise any parameter related to the object and/or its processing, and may thus not be restricted to the examples concerning alignment data as described above. By the method as described here, any type of diagnostic information may be derived by suitable operations (such as the operations described above) on detected parameters, e.g., measurement results for one or for a plurality of objects, which have been stored in the database.

The method is suitable in particular for a lithographic apparatus, as down-time of such a highly costly machine is to be prevented as much as possible. By the diagnosing as described here, down time may be reduced, as diagnostic information may be derived from the data stored in the database. Further, accuracy requirements posed upon a lithographic apparatus are extremely high. By the method as described here, drift or other errors of the lithographic apparatus which may have an adverse effect on accuracy may be derived from the data stored in the database. Thereby, a timely intervention may be allowed to, e.g., prevent erroneous operation by the lithographic apparatus, thus preventing errors during processing of substrates. Further, a lithographic apparatus may commonly be used in a production environment where a plurality of devices which process a same substrate may be present. Due to the plurality of devices, a cause of an error or of a critical condition may be difficult to retrieve, and would require testing or diagnosing of each of devices separately to find a cause. By suitable operations on the data stored in the database as described here, correlation's between data may provide for cause of the error or critical conditions, thus enabling to initiate corrective actions without a need to take a plurality of devices out of production. Furthermore, different production devices may make use of different algorithms, such as for example different geometric algorithms to determine the position of the window. Thereby, additional sources of error may be introduced, as the different algorithms may result in different positions of the window. By the methods as described here, these additional sources of error may, as described above, be dealt with more easily, as previous results are stored in the database and may be taken into account when performing a following processing.

In addition to the embodiments described above, the invention as described herein may also be embodied in a form of a computer program comprising program instructions too, when running on a computer, perform the methods as described here. Also, the invention may be embodied in a form of a dataprocessing device comprising such program instructions. The data processing device may be operationally connected to a lithographic apparatus and a database.

The window as referred to in this document may in addition or instead of the above comprise a likelihood window, i.e., indicate an area on the substrate in which the alignment mark may be found with a certain likelihood, e.g., a predetermined minimum likelihood. In such a situation, the window may, e.g., be defined by a likelihood function, e.g., providing for a high likelihood to find the mark close to a centre of the window and a diminishing likelihood the further away from the substrate. An example of a window of this type may be a gaussian likelihood window. In this context the term edge or side of the window may have a limited physical meaning.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method for aligning a substrate in a lithographic apparatus, the method comprising:
   a) determining from a geometric reference of the substrate a position of a window on the substrate, the window indicating an area in which an alignment mark of the substrate may be expected;
   b) measuring a position of the alignment mark in the window;
   c) determining a relationship between the measured position of the alignment mark and the position of the window;
   d) storing in a database for the substrate the relationship between the measured position of the alignment mark and the position of the window;
   e) aligning the substrate making use of the measured position of the alignment mark; and
   f) repeating a) to e) for a following aligning of the substrate, wherein prior to b) the position of the window is amended making use of the relationship between the measured position of the alignment mark and the position of the window as stored in the database for at least one preceding aligning.

2. The method according to claim 1, wherein a) comprises detecting an edge of the substrate and determining with a geometric algorithm the position of the window with regard to the edge.

3. The method according to claim 1, wherein c) comprises determining an offset between the measured position of the alignment mark and a position of a centre of the window.

4. The method according to claim 3, wherein d) comprises storing the offset in the database.

5. The method according to claim 1, wherein, when repeating c), the position of the window in c) comprises the position of the window as determined in a).

6. The method according to claim 1, wherein, when repeating c), the position of the window in c) comprises the amended position as amended before b).

7. The method according to claim 1, wherein d) further comprises relating in the database the relationship to a substrate identification to identify the substrate.

8. The method according to claim 1, wherein the relationship between the measured position of the alignment mark and the position of the window comprises the offset between the measured position of the alignment mark and the position of the centre of the window, and wherein f) comprises averaging the offset as stored in the database for at least two preceding alignments of the substrate.

9. The method according to claim 8, wherein prior to averaging, the offsets as stored in the database for at least two preceding alignments of the substrate are multiplied by a weight factor, the averaging being performed on the offsets multiplied by the weight factor.

10. The method according to claim 9, wherein the weight factor increases towards an end value after a plurality of alignments.

11. The method according to claim 10, wherein the end value is between 0.5 and 0.7.

12. The method according to claim 8, further comprising determining a drift error of the lithographic apparatus by
   determining, for at least two substrates, differences between the stored offsets and the averaged offset for each of the at least two substrates; and
   determining a drift error of the lithographic apparatus by determining an average of the differences between the stored offsets and the averaged offset as determined for each of the at least two substrates.

13. A method for determining a drift error of a lithographic apparatus, the method comprising:
   a) determining from a geometric reference of at least two substrates a position of a window on each of the substrates, the window indicating an area in which an alignment mark of the substrate may be expected;
   b) measuring for each of the substrates a position of the alignment mark in the window;
   c) determining for each of the substrates a relationship between the measured position of the alignment mark and the position of the window;
   d) storing in a database for each of the substrates the relationship between the measured position of the alignment mark and the position of the window;
   e) repeating a) to d) at least once;
   f) averaging for each of the substrates the relationships as stored in d);
   g) determining, for each of the at least two substrates, a difference between the stored relationships and the averaged relationships; and
   h) determining the drift error of the lithographic apparatus by determining an average of the differences as determined in g).

14. The method according to claim 13, wherein, when repeating a) to d), the repeating of b) is performed on another lithographic apparatus than a previous performing of b).

15. A method for aligning a substrate in a lithographic apparatus, the method comprising:
   a) determining from a geometric reference of the substrate respective positions of at least two windows on the substrate, the windows indicating areas in which a respective alignment mark of the substrate may be expected;
   b) measuring a position of the respective alignment mark in each of the windows;
   c) determining for each of the alignment marks, a difference between the measured position of the respective alignment mark and an expected alignment mark position of the respective window;

d) determining a position of the substrate at which a total of the differences would be reduced; and e) bringing the substrate to the determined position.

16. A computer program product embodied on a computer readable medium encoded with computer executable instructions that when executed by a computer, perform a method for aligning a substrate in a lithographic apparatus, the method comprising:
   a) determining from a geometric reference of the substrate a position of a window on the substrate, the window indicating an area in which an alignment mark of the substrate may be expected;
   b) measuring a position of the alignment mark in the window;
   c) determining a relationship between the measured position of the alignment mark and the position of the window;
   d) storing in a database for the substrate the relationship between the measured position of the alignment mark and the position of the window;
   e) aligning the substrate making use of the measured position of the alignment mark; and
   f) repeating a) to e) for a following aligning of the substrate, wherein prior to b) the position of the window is amended making use of the relationship between the measured position of the alignment mark and the position of the window as stored in the database for at least one preceding aligning.

17. A computer program product embodied on a computer readable medium encoded with computer executable instructions that when executed by a computer, perform a method for aligning a substrate in a lithographic apparatus, the method comprising:
   a) determining from a geometric reference of the substrate respective positions of at least two windows on the substrate, the windows indicating areas in which a respective alignment mark of the substrate may be expected;
   b) measuring a position of the respective alignment mark in each of the windows;
   c) determining for each of the alignment marks, a difference between the measured position of the respective alignment mark and an expected alignment mark position of the respective window;
   d) determining a position of the substrate at which a total of the differences would be reduced; and
   e) bringing the substrate to the determined position.

18. A data processing device comprising a data storage medium encoded with computer executable instructions for aligning a substrate in a lithographic apparatus according to a method comprising:
   a) determining from a geometric reference of the substrate a position of a window on the substrate, the window indicating an area in which an alignment mark of the substrate may be expected;
   b) measuring a position of the alignment mark in the window;
   c) determining a relationship between the measured position of the alignment mark and the position of the window;
   d) storing in a database for the substrate the relationship between the measured position of the alignment mark and the position of the window;
   e) aligning the substrate making use of the measured position of the alignment mark; and
   f) repeating a) to e) for a following aligning of the substrate, wherein prior to b) the position of the window is amended making use of the relationship between the measured position of the alignment mark and the position of the window as stored in the database for at least one preceding aligning,
   wherein the data processing device is operationally connected to the lithographic apparatus and to the database.

19. A data processing device comprising a data storage medium encoded with computer executable instructions for aligning a substrate in a lithographic apparatus according to a method comprising:
   a) determining from a geometric reference of the substrate respective positions of at least two windows on the substrate, the windows indicating areas in which a respective alignment mark of the substrate may be expected;
   b) measuring a position of the respective alignment mark in each of the windows;
   c) determining for each of the alignment marks, a difference between the measured position of the respective alignment mark and an expected alignment mark position of the respective window;
   d) determining a position of the substrate at which a total of the differences would be reduced; and
   e) bringing the substrate to the determined position,
   wherein the data processing device is operationally connected to the lithographic apparatus and to the database.

* * * * *